United States Patent [19]
Watanabe et al.

[11] Patent Number: 5,612,623
[45] Date of Patent: Mar. 18, 1997

[54] FAILURE DIAGNOSTIC APPARATUS AND METHOD FOR A RESISTOR ELEMENT

[75] Inventors: Makoto Watanabe, Nisshin; Mitsuhiko Masegi, Nukata-gun, both of Japan

[73] Assignee: Nippondenso Co., Ltd., Kariya, Japan

[21] Appl. No.: 426,582

[22] Filed: Apr. 21, 1995

[30] Foreign Application Priority Data

May 27, 1994 [JP] Japan .................................. 6-138041

[51] Int. Cl.$^6$ .................................................. G01R 27/26
[52] U.S. Cl. ........................ 324/549; 340/436; 324/713; 324/711; 280/738
[58] Field of Search .................................. 324/502, 549, 324/711, 712–715, 718; 340/436, 438; 280/738

[56] References Cited

U.S. PATENT DOCUMENTS

| | | | |
|---|---|---|---|
| 2,877,308 | 3/1959 | Reiner et al. | 324/109 |
| 3,611,124 | 10/1971 | Bollons | 324/74 |
| 4,054,835 | 10/1977 | Los et al. | 324/109 |
| 4,262,254 | 4/1981 | Poss | 324/457 |
| 4,287,431 | 9/1981 | Yasui et al. | 307/10 R |
| 4,296,447 | 10/1981 | Lewis | 324/252 |
| 4,535,287 | 8/1985 | Milkovic | 324/130 |
| 4,835,513 | 5/1989 | McCurdy et al. | 340/436 |
| 5,081,442 | 1/1992 | Ito et al. | 340/438 |
| 5,166,880 | 11/1992 | Furui | 340/436 |
| 5,268,643 | 12/1993 | Aso et al. | 324/502 |
| 5,357,189 | 10/1994 | Egami | 324/706 |

FOREIGN PATENT DOCUMENTS 624289 2/1994 Japan .

*Primary Examiner*—Maura K. Regan
*Attorney, Agent, or Firm*—Cushman, Darby & Cushman Ip Group of Pillsbury Madison & Sutro LLP

[57] ABSTRACT

A monitor current to a squib as an air bag actuating element conducts in one and the opposite directions alternately. Each produced voltage value is differentially amplified with a positive reference voltage and a difference between the amplified voltages are calculated. Thus, an offset voltage of an operational amplifier used for the differential amplification is cancelled, and the difference between the two detected voltages becomes a voltage value which will be produced by a monitor current twice as large in current level. Thus, the squib is diagnosed accurately.

25 Claims, 2 Drawing Sheets

TIME

FAILURE DIAGNOSTIC APPARATUS AND METHOD FOR A RESISTOR ELEMENT

CROSS REFERENCE TO RELATED APPLICATION

This application is based on and claims priority of Japanese Patent Application No. 6-138041 filed May 27, 1994, the content of which is incorporated herein by reference.

BACKGROUND OF THE INVENTION

1. Field of the Invention

The present invention relates to a failure diagnostic apparatus and method for a resistor element such as a squib of a passive safety system installed in an automotive air bag system or a pretensioner of an automotive seat belt system.

2. Related Art

A prior art passive safety system like an air bag system has a small actuating element such as a squib so as to be activated immediately upon an occurrence of collision by a signal upon detecting the occurrence of collision by a G sensor. A resistor is the main portion of the squib. Therefore, the squib is heated up and detonates by conducting electricity through the resistance so that the safety device is operated. Since the squib has to be heated up instantaneously, it usually has a structure like a filament of a flash lamp. Thus, it cannot have a mechanically strong structure. However, since the squib is required to work without fail at the occurrence of collision, the squib should be always checked to determine whether it is in an operable condition or in an inoperable (failure) condition.

Usually checking of the squib is made on whether a resistance value thereof is normal or not. A small monitor current for checking is conducted through the squib. A voltage at both sides of the squib is checked. The resistance value is determined from the voltage value and the resistance value is checked whether it is normal or not. Since the squib is used to produce a lot of gas by heat only upon the detection of the collision, a large amount of current cannot be conducted as the monitor current and it is limited to about 50 mA. It is impossible to flow more current since it has more risks of unnecessarily operating the squib itself. Since the resistance value of the squib has normally only about 2Ω, the voltage value detected at both sides of the squib is small. Thus, an amplifier is used for amplifying the voltage value at both sides of the squib. Since the amplifier is mounted easily on a circuit substrate of the device as an operational amplifier due to a recent semiconductor manufacturing technology, the small voltage can be amplified easily.

A high performance operational amplifier is, however, high in cost, and consequently an operational amplifier usually used for a precision measuring equipment cannot be used from the standpoint of cost. Therefore, it is desired that the voltage is detected by a general purpose operational amplifier. However, since a general purpose operational amplifier produces errors such as offset voltages, such errors cannot be ignored relative to the small voltage described above. Thus, precise voltage value cannot be obtained, and the resistance value of the squib cannot be determined precisely either. Hence, it is likely that the squib, even if in the failure condition, will be determined normal erroneously, and the passive safety device may not be actuated upon the vehicle collision.

SUMMARY OF THE INVENTION

It is an object of the present invention to provide a failure diagnostic apparatus and method for detecting condition of a resistor element, such as a squib, more precisely without increasing a monitor current.

A failure diagnostic apparatus for an automotive passive safety device according to the present invention comprises monitor current drive means flowing a monitor current in opposite directions alternately from both sides of a resistor element. The apparatus further comprises detecting means detecting a difference between monitor voltages produced across the resistor element when electricity flows from opposite directions alternately, and determination means determining an existence of failure of the resistor element by obtaining a resistance value thereof from the calculated difference.

Preferably, the detecting means includes amplifying means amplifying a voltage drop of the resistor element relative to a fixed positive voltage as a reference. More preferably, the monitor drive means includes conducting path switching means for reversing the current conducting direction with a single electric power source.

In a failure diagnostic method according to the present invention, each monitor current is conducted in opposite directions from both sides of a resistor element, and a difference of each voltage produced at both sides thereof is detected. A resistance value of the resistor element is calculated from the difference of the voltages so that an existence of failure of the resistor element is determined.

With the monitor current flowing through the resistor element in one direction and in the opposite direction alternately and each voltage value being amplified relative to a reference voltage, the difference between the two detected voltages becomes the same detected voltage value as the case where the monitor current is increased to twice as large. Therefore, the resistance value as a diagnostic signal having the least error can be calculated.

According to the present invention, since the detected voltage value twice as large is obtained, the resistance value can be determined more precisely and a failure of the resistor element can be detected exactly. Further, since the detected voltages in each current direction are measured relative to the fixed positive voltage, both detected voltages can have positive values, the difference is obtained simply by calculation and the resistance value can be obtained easily. Further, the monitor current directions can be changed by switching conductivity by the single electric power source without providing positive and negative electric power sources so that it is especially useful when an automotive battery is the only electric power source.

Still further, the voltage value obtained by differentially amplifying is measured as voltage values of two kinds including the same offset voltage of the operational amplifier. By subtracting one value from the other, the offset voltage can be cancelled. Moreover, since the resistance value can be calculated as if the monitor current is made to twice as large, highly precise measurement can be attained.

DETAILED DESCRIPTION OF THE EMBODIMENTS

The present invention will be described in detail with reference to the accompanying drawings.

Figure 1:
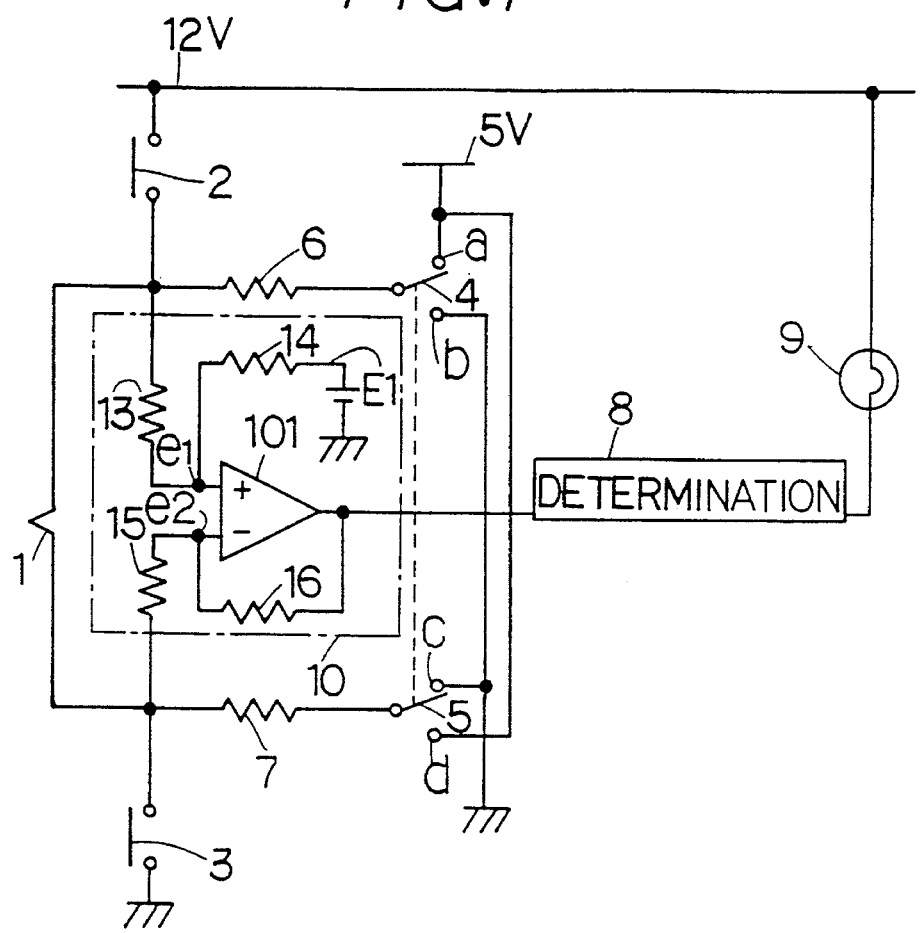
FIG. 1 is a circuit diagram illustrating a failure diagnostic apparatus for an automotive air bag system in the first embodiment.

FIG. 1 is a circuit diagram illustrating a failure diagnostic apparatus assembled to an air bag system as an automotive passive safety system in the first embodiment of the present invention. In the apparatus, squib 1 as actuating means for actuating an air bag is connected between electric power source 12 V as an air bag drive power source and the ground. Switch 2 as an acceleration/deceleration sensor (G sensor) and switch 3 as another G sensor are connected in series and each has respective turn-on threshold. Each of switches 2 and 3 is usually open, i.e., normally-open type. Switch 2 is turned on with a low collision impact of about 2 G. Switch 3 is turned on with a large collision impact of about 10 G. Both switches 2 and 3 are installed on a front fender and a floor tunnel of an automotive vehicle, respectively. The G sensors may be a mechanical, piezo-resistive or piezoelectric type. When the vehicle with the air bag system is subjected to collision and switches 2 and 3 are turned on, an electric power from the power source 12 V is supplied to squib 1 so that squib 1 ignites and inflates the air bag.

Selector switch 4 and selector switch 5 being a single-throw dipole switch are normally connected to the sides of "a" and "c", respectively so that a monitor current $I_m$ flows from resistor 6 to squib 1. However, when turned on, the switches 4 and 5 are connected to the sides of "b" and "d", respectively so that a monitor current $-I_m$ flows resistor 7 to squib 1. Although FIG. 1 shows mechanical switches 4 and 5, electronic switches using transistors can be used. Resistor 6 and resistor 7 having respective resistances R6 and R7 are current limiting resistors conducting monitor current $I_m$ or $-I_m$ to squib 1. By fixing R6=R7, the current value to squib 1 is fixed so as not to exceed the limit value (usually 50 mA as the monitor current). The direction of the monitor current is controlled by switching the dipole switch 4 and 5 so that the monitor current conducts through squib 1 by applying electric power source 5 V. Although conducting the monitor current continuously is not always necessary, it is desired that the monitor current always conducts so as to determine failure of squib 1 continuously. Thus, the monitor current (current value $I_m$ or $-I_m$) always conducts in either direction.

Differential amplifier circuit 10 in FIG. 1 receives a voltage across squib 1 as an input voltage into operational amplifier 101 having resistors 13 through 16 and amplifies a potential difference on opposite ends of squib 1. In the circuit 10, by applying a reference voltage E1 (E1=Vcc/2 and Vcc=5 V) to a positive (+) input side through resistor 14 having a high resistance R14, operation voltage of operational amplifier 101 is based at the positive potential. Here, resistances R13 and R15 of resistors 13 and 15 are set as R13=R15, resistances R14 and R16 of resistors 14 and 16 are set as R14=R16. Since the operational amplifier 101 with a single electric power source (Vcc=5 V) is used in the known manner, variation in voltage detection by reversal of a signal voltage polarity is restrained and errors caused by an offset voltage of the operational amplifier 101 are reduced. A resistance value of squib 1 is calculated from an output of differential amplifier circuit 10. Determination circuit 8 determining whether squib 1 is in failure or not is connected to operational amplifier 101. Alarm means (alarm lamp) 9 lightening upon the failure is connected to the circuit 8. The determination circuit 8 is composed of, for example, an A/D converter, memories and a CPU (not shown in the figure) so that calculation of a resistance value of squib 1 and an abnormality or failure determination are carried out by comparing the resistance value with a reference value. This kind of calculation and determination is known in the art and, hence, a detailed explanation is omitted for brevity.

Next, detection of the squib failure in the present embodiment will be explained in further detail.

When switches 2 and 3 are off because of no collision and switches 4 and 5 are connected to the sides "a" and "c", respectively, as shown in FIG. 1, the monitor current $I_m$ restricted by resistors 6 and 7 conducts through squib 1. The value of $I_m$=50 mA is the maximum for checking squib 1. Therefore, R6+R7 is fixed so that $I_m$=5 V/(R6+R7) does not exceed $I_m$=50 mA. By the current $I_m$ thus determined, a voltage from some mV to some 10 mV is produced at opposite ends of squib 1 to develop a monitor voltage (e1–e2). The (+) input of differential amplifier 10 receives the e1 voltage and the (–) input receives the e2 voltage. Thus, when the current $I_m$ is conducted, the voltage across the squib 1 is amplified by differential amplifier 10. An output $V_0$ of amplifier 10 is produced as a positive value $V_a$ which is equal to a value, i.e., K×(e1–e2)+E1 with K being an amplification coefficient. It is to be noted that the output voltage $V_0$ is in the range from some 100 mV to some V under the condition that the operational amplifier 101 is biased by the voltage E1, (e1–e2) is from some mV to some 10 mV and the amplification coefficient K is 100.

With switches 4 and 5 being switched to the sides "b" and "d", respectively, the monitor current $-I_m$ conducts in the opposite direction producing a monitor voltage (e1'–e2'). The current value is the same $(-I_m)$ and the output $V_0$ of operational amplifier 101 becomes K×(e1'–e2') +E1=–K×(e1–e2)+E1, with e1' and e2' being two input voltages of the operational amplifier 101. The output voltage $V_0$ is from some 100 mV to some V in opposite polarity relative to E1 (e.g., 2.5 V). Thus, squib resistance value $R_{SQ}$ is calculated in determination circuit 8 by the following equation with the amplification coefficient K of the operational amplifier 101.

$$R_{SQ}=(V_a-V_b)/(2I_m \times K) \qquad (1)$$

Since the value of $V_a$ and $V_b$ are both positive, an offset voltage produced in operational amplifier 101 will be the same for each. Therefore, the offset voltage of operational amplifier 101 is cancelled out by the subtraction in the above equation (1) so that, with a cause of errors being reduced, the subtracted value, $V_a-V_b=2K(e1-e2)$, becomes twice as large as K(e1–e2) compared with the case of conducting the monitor current only in one direction. In determination circuit 8, the calculation result of equation (1) and predetermined normal range values are compared so that a signal to active lamp 9 is produced in the event of failure of the squib 1 such as short-circuiting ($R_{SQ}$ being too small) and breakage ($R_{SQ}$ being too large).

Figure 2A:
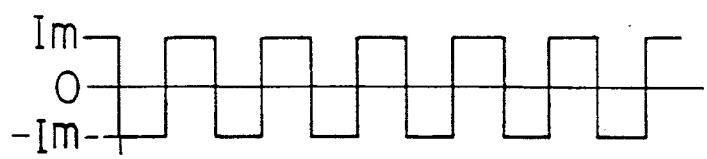
FIG. 2A and 2B are wave form charts illustrating a monitor current and a voltage in the first embodiment, respectively.
Figure 2B:
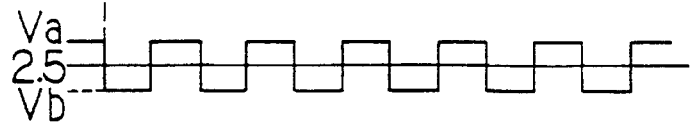

FIG. 2A and 2B illustrate the monitor current $I_m$ and differential amplifier output $V_0$, respectively, in the repeated switching of switches 4 and 5 mentioned above and $V_a$ and $V_b$ are produced in correspondence to one direction monitor current $I_m$ and the opposite direction current $-I_m$, respectively. Those values $V_a$ and $V_b$ are stored and used for calculating the resistance value $R_{SQ}$. When determination circuit 8 is composed of a micro-computer, the current values $I_m$ are obtained many times and the mean value is calculated so that a more precise squib resistance value $R_{SQ}$ can be calculated. Also, by conducting electricity all the time in either direction alternately, the air bag system as the passive safety system can be always monitored.

Figure 3:
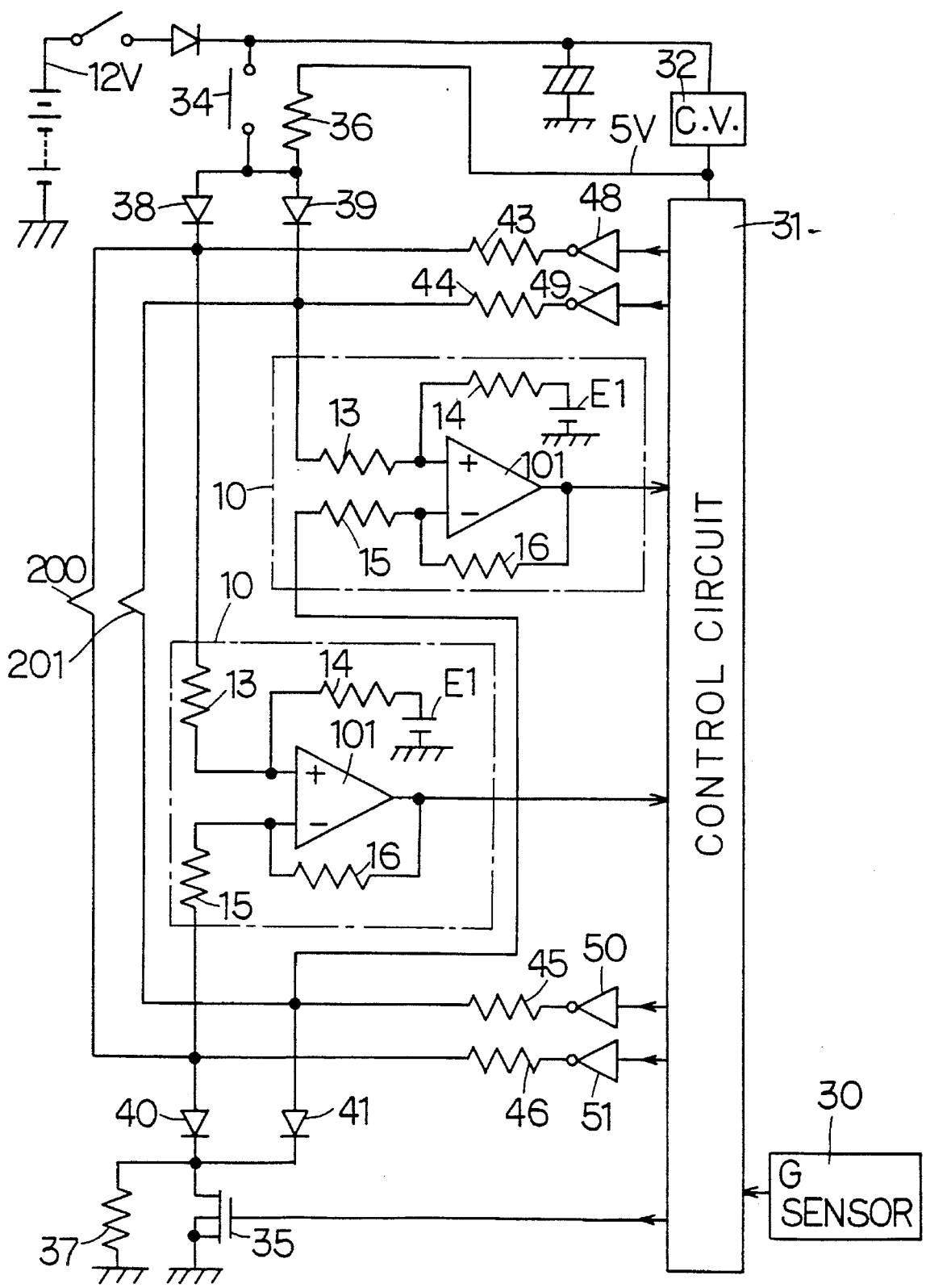
FIG. 3 is a circuit diagram illustrating the second embodiment of the present invention.

FIG. 3 illustrates the second embodiment having more than one squib. Switch 34 which is turned on by acceleration or deceleration of about 2G and a second switch transistor 35, which is turned on by G sensor 30 through control circuit 31 are connected at opposite ends of parallelly-connected squibs 200 and 201 between the power supply 12 V and the ground through diodes 38 through 41. When large acceleration or deceleration occurs due to vehicle collision, switch 34 and transistor 35 are turned on and a large electric current flows through squibs 200 and 201 so that an air bag is operated.

The diagnostic apparatus basically includes two circuits connected in parallel and two differential amplifier circuits 10 are connected to squibs 200 and 201, respectively. Each differential amplifier circuit has the same circuit configuration as in FIG. 1. Since each circuit 10 has input resistors 13 and 15, reference voltage E1 is applied through current limiting resistor 14 to the positive (+) input side, and negative feedback resistor 16 is connected to a negative (−) input side. Each output is connected to an A/D input of control circuit 31 functioning as a diagnostic circuit, determination circuit and current conducting path control circuit.

For squibs 200 and 201, instead of switches 4 and 5 used for switching direction of monitor current $I_m$ in FIG. 1, control circuit 31 controls monitor current conduction direction by using inverters 48 through 51 connected to respective resistors 43 through 46 (5 V is applied by a complementary output). That is, a voltage at both ends of squib 200 can be detected by circuit 10 when an output of inverter 48 is high and an output of inverter 51 is low. A voltage of squib 200 is also detected by the same circuit 10 when an output of inverter 48 is low and an output of inverter 51 is high. Thus, the resistance value of squib 200 can be calculated from those two voltage values in the same manner as in the first embodiment. It is also the same for squib 201. The alarm lamp in FIG. 1 is not shown.

As shown in FIG. 3, in order to check or diagnose open failures of switch 34 and transistor 35, resistors 36 and 37 are connected thereto parallelly (detecting circuit therefor is not shown). The current flows only in one direction through diodes 38 through 41 so that power voltage 5 V from constant voltage source 32 is always applied to squibs 200 and 201 with a constant current $i_c$. Therefore, because of the use of resistors 36 and 37 in the current conduction path, current values $I_m = i_m + i_c$ and $I_m' = i_m - i_c$ differ depending on the conducting direction of the monitor current. The monitor current $i_m$ denotes a current which should flow through the squib in the most ideal case. Thus, the resistance value of squib 200 is calculated by the equation (2) below under the assumption that output voltage values of the amplifier 101 in both directions against squib 200 are $V_a$ and $V_b$ and the amplifying coefficient K of the differential amplifier circuit is 25.

$$R_{SQ} = (V_a - V_b)/[25(I_m + I_m')] \qquad (2)$$

Likewise, the resistance value $R_{SQ}$ for squib 201 is obtained from equation (2).

E1 is determined to be Vcc/2 and operation central voltage value of the positive (+) input of the operational amplifier 101 is determined to be close to a squib voltage value so that response of the operational amplifier 101 becomes faster and stabilized.

In resistance measuring of a resistor element of the present invention, not only error factors produced in the operational amplifier are canceled but also signal intensity becomes twice as large compared with the conventional device, so that more precise diagnosis of the resistor element is carried out. It is to be understood that, because the monitor current and the amplification coefficient are fixed, the above-described checking operation using the equation (1) or (2) may be modified to perform the similar checking operation by comparing the subtracted output voltage with predetermined voltage values without calculating the resitance value of the squib.

The present invention having been described hereinabove should not be limited to the first and second embodiments but may be modified in many ways without departing from the spirit of the invention.

What is claimed is:

1. A failure diagnostic apparatus for a resistor element, said apparatus comprising:

monitor drive means for conducting monitor currents through said resistor element in opposite directions alternately;

detecting means for detecting a difference of monitor voltages produced across said resistor element when said monitor currents are conducted in opposite directions and producing a voltage difference which is larger than each of said monitor voltages; and determination means for determining a failure of said resistor element by obtaining a resistance value of said resistor element from the value of said voltage difference.

2. A failure diagnostic apparatus in claim 1, wherein said resistor element includes an actuating device for actuating an automotive passive safety system, and wherein said detecting means includes amplifying means for amplifying differentially said monitor voltages across said resistor element while being biased by a predetermined positive voltage as a reference so that first and second differential outputs are produced, respectively.

3. A failure diagnostic apparatus in claim 1, wherein said monitor drive means for includes conducting path switching means reversing the direction of said monitor currents from a single electric power source.

4. A failure diagnostic apparatus in claim 1, wherein said resistor element includes a squib for an automotive air bag system, wherein said detecting means includes an operational amplifier having two input terminals to which said monitor voltages are applied for differentially amplifying said monitor voltages and a reference voltage, and wherein said reference voltage is determined to be one half of an operating voltage of said operational amplifier.

5. A method of diagnosing a resistor element adapted to be operated electrically, said method comprising the steps of:

conducting a first monitor current and a second monitor current through said resistor element in opposite directions alternately so that said resistor element produces a first monitor voltage and a second monitor voltage corresponding to a resistance value thereof and said first and second monitor currents, respectively;

differentially amplifying said first and second monitor voltages produced by said resistor element and a reference voltage so that first and second differential outputs are produced, respectively;

calculating a difference between said first and second differential outputs, said difference being larger than each of said first add second differential outputs; and determining a failure of said resistor element by comparing said calculated difference with a predetermined value.

6. A method in claim 5 further comprising the step of:
   storing said first and second outputs so that said difference is calculated by the use thereof.

7. A method in claim 6, wherein said step of differentially amplifying is performed by a differential amplifier, and wherein said reference voltage is determined to be one half of an operating voltage of said differential amplifier.

8. A method in claim 7, wherein said resistor element includes a squib for inflating an air bag of an automobile.

9. A failure diagnostic apparatus in claim 1, wherein said monitor currents conducted in opposite directions have a same current value.

10. A failure diagnostic apparatus in claim 1, wherein said monitor currents flow through a same current path in said opposite directions.

11. A failure diagnostic apparatus in claim 2, wherein said voltage difference is twice as large as each of said first and second differential outputs.

12. A failure diagnostic apparatus in claim 1, wherein said resistor element includes a plurality of squibs for inflating airbags of an automobile.

13. A failure diagnostic apparatus in claim 1, further comprising:
   constant current conducting means for conducting a constant current through said resistor element in addition to said monitor currents, whereby a value of said monitor voltage produced when a first monitor current is conducted in one direction is different from a value of said monitor voltage produced when a second monitor current is conducted in the other direction.

14. A method as in claim 5, wherein said first and second monitor currents are conducted during the conducting step with the same current value respectively in said opposite directions alternately through said resistor element.

15. A method in claim 5, wherein said conducting step conducts said first and second monitor currents through the same current path in said opposite directions alternately.

16. A method as in claim 5, wherein said difference calculated by said calculating step is twice as large as each of said first and second differential outputs.

17. A method as in claim 5, wherein said resistor element includes a plurality of squibs for inflating airbags of an automobile.

18. A method as in claim 5, further comprising the steps of:
   conducting a constant current through said resistor element in addition to said first and second monitor currents, whereby a value of said first monitor voltage is different from a value of said second monitor voltage.

19. A failure diagnostic apparatus for a resistor element, comprising:
   a resistor element,
   conducting means for conducting a monitor current in a first direction through said resistor element and alternately in a second opposite direction through said resistor element to produce from said monitor current when in said first direction first and second voltages at opposite ends of said resistor element and to produce from said monitor current when in said second opposite direction third and fourth voltages at opposite ends of said resistor element,
   differential amplifier means connected across said resistor element for differentially amplifying said first and second voltage with a reference voltage to produce a first output voltage which is positive relative to said reference voltage and for subsequently differentially amplifying said third and fourth voltage with said reference voltage to produce a second output voltage which is negative relative to said reference voltage, both said first and second output voltages including an offset voltage caused by said differential amplifier means, and
   determination means for determining a failure of said resistor element by obtaining a resistance value of said resistor element based on a difference between said first and second output voltages which cancels said offset voltage of said output voltages.

20. Apparatus as in claim 19 wherein said conducting means includes
   switching means for applying a source voltage across said resistor element in one direction to produce said monitor current in said first direction and alternately for applying said source voltage across said resistor element in another direction to produce said monitor current in said second opposite direction.

21. Apparatus as in claim 20 wherein said first and third voltages are equal and said second and fourth voltages are equal.

22. Apparatus as in claim 21 wherein said differential amplifier means has an amplification coefficient of K and the difference of said first and second output voltages is equal to 2K times the difference of said first and second voltages.

23. Apparatus as in claim 19 including a constant voltage source connected across said resistor element for producing a constant current through said resistor element in said first direction continuously while said monitor current is in said first and second opposite directions.

24. Apparatus as in claim 23 wherein said resistor element is a squib and said apparatus further includes:
   a first G-operated switch means connected to one end of said squib,
   a second G-operated switch means connected to another end of said squib, and
   first and second resistors,
   said constant voltage source being connected across said squib by said first resistor at said one end of said squib and by said second resistor at said another end of said squib with said first resistor being in parallel with said first G-operated switch means and said second resistor being in parallel with said second G-operated switch means.

25. Apparatus as in claim 24 including
   a second squib in parallel with the first-mentioned squib, and
   second differential amplifier means connected across said second squib.

* * * * *